United States Patent
Maenosono et al.

(10) Patent No.: US 11,257,744 B2
(45) Date of Patent: *Feb. 22, 2022

(54) METHOD OF FORMING VIAS USING SILICON ON INSULATOR SUBSTRATE

(71) Applicant: MICRON TECHNOLOGY, INC., Boise, ID (US)

(72) Inventors: Toshiyuki Maenosono, Higashihiroshima (JP); Yuta Kikuchi, Higashihiroshima (JP); Manabu Ito, Higashihiroshima (JP); Yoshihiro Saeki, Fuchu (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/543,378

(22) Filed: Aug. 16, 2019

(65) Prior Publication Data
US 2019/0371720 A1    Dec. 5, 2019

Related U.S. Application Data

(62) Division of application No. 15/472,184, filed on Mar. 28, 2017, now Pat. No. 10,418,311.

(51) Int. Cl.
*H01L 23/498* (2006.01)
*H01L 23/538* (2006.01)
(Continued)

(52) U.S. Cl.
CPC .. *H01L 23/49827* (2013.01); *H01L 21/76804* (2013.01); *H01L 21/76843* (2013.01);
(Continued)

(58) Field of Classification Search
CPC .......... H01L 23/49827; H01L 23/49838; H01L 23/49894; H01L 23/5383; H01L 23/5384;
(Continued)

(56) References Cited

U.S. PATENT DOCUMENTS

| | | |
|---|---|---|
| 5,489,554 A | 2/1996 | Gates |
| 6,620,731 B1 | 9/2003 | Farnworth et al. |

(Continued)

FOREIGN PATENT DOCUMENTS

| | | |
|---|---|---|
| JP | 2005-93954 A | 4/2005 |
| JP | 2015-41718 A | 3/2015 |

OTHER PUBLICATIONS

U.S. Appl. No. 15/472,184, entitled: "Method of Forming Vias Silicon on Insulator Substrate" filed on Mar. 28, 2017, Published as U.S. Pub. No. 2018/0286795.

*Primary Examiner* — David A Zarneke
(74) *Attorney, Agent, or Firm* — Dorsey & Whitney LLP (57) ABSTRACT

Apparatuses and methods using a silicon on insulator (SOI) substrate are described. An example apparatus includes: a substrate including a first surface and a second surface opposite to the first surface; a circuit formed in the first surface; a first electrode through the substrate from the first surface to the second surface; and a first insulative film around the first electrode. The first electrode includes: a first portion formed in the substrate; and a second portion continuous to the first portion and protruding from the second surface. The first insulative film is formed between the first portion of the first electrode in the substrate and extending to a side surface of the second portion of the first electrode.

16 Claims, 4 Drawing Sheets

(51) Int. Cl.
*H01L 23/00* (2006.01)
*H01L 21/768* (2006.01)

(52) U.S. Cl.
CPC .. *H01L 21/76877* (2013.01); *H01L 21/76898* (2013.01); *H01L 23/49838* (2013.01); *H01L 23/49894* (2013.01); *H01L 23/5383* (2013.01); *H01L 24/03* (2013.01); *H01L 24/05* (2013.01); *H01L 24/11* (2013.01); *H01L 24/13* (2013.01); *H01L 23/5384* (2013.01); *H01L 24/16* (2013.01); *H01L 2224/03912* (2013.01); *H01L 2224/0401* (2013.01); *H01L 2224/05647* (2013.01); *H01L 2224/05666* (2013.01); *H01L 2224/06181* (2013.01); *H01L 2224/11002* (2013.01); *H01L 2224/1146* (2013.01); *H01L 2224/1161* (2013.01); *H01L 2224/1181* (2013.01); *H01L 2224/11462* (2013.01); *H01L 2224/11616* (2013.01); *H01L 2224/11622* (2013.01); *H01L 2224/13007* (2013.01); *H01L 2224/13009* (2013.01); *H01L 2224/13022* (2013.01); *H01L 2224/13023* (2013.01); *H01L 2224/13025* (2013.01); *H01L 2224/13083* (2013.01); *H01L 2224/13111* (2013.01); *H01L 2224/13147* (2013.01); *H01L 2224/13155* (2013.01); *H01L 2224/1403* (2013.01); *H01L 2224/14051* (2013.01); *H01L 2224/14181* (2013.01); *H01L 2224/16145* (2013.01); *H01L 2224/16146* (2013.01); *H01L 2224/81193* (2013.01)

(58) Field of Classification Search
CPC ......... H01L 24/03; H01L 24/05; H01L 24/11; H01L 24/1316; H01L 2224/13025
See application file for complete search history.

(56) References Cited

U.S. PATENT DOCUMENTS

| | | | |
|---|---|---|---|
| 6,730,540 B2 | 5/2004 | Siniaguine | |
| 6,882,030 B2 | 4/2005 | Siniaguine | |
| 7,060,601 B2 | 6/2006 | Savastiouk et al. | |
| 7,138,710 B2* | 11/2006 | Fukazawa | H01L 23/481 257/686 |
| 7,358,602 B2 | 4/2008 | Hara | |
| 7,361,532 B2 | 4/2008 | Fukazawa | |
| 7,491,582 B2 | 2/2009 | Yokoyama et al. | |
| 7,528,006 B2 | 5/2009 | Arana et al. | |
| 7,605,463 B2 | 10/2009 | Sunohara et al. | |
| 7,833,895 B2* | 11/2010 | Bonifield | H01L 23/481 438/598 |
| 8,039,385 B1 | 10/2011 | West et al. | |
| 8,089,161 B2 | 1/2012 | Komuro | |
| 8,106,518 B2* | 1/2012 | Kawashita | H01L 24/12 257/774 |
| 8,264,077 B2* | 9/2012 | Chiou | H01L 24/05 257/698 |
| 8,564,139 B2* | 10/2013 | Lee | H01L 24/03 257/774 |
| 8,629,042 B2 | 1/2014 | Yang et al. | |
| 8,643,148 B2* | 2/2014 | Lin | H01L 21/486 257/620 |
| 8,766,423 B2 | 7/2014 | Yamaguchi et al. | |
| 8,987,869 B2 | 3/2015 | Jin et al. | |
| 9,006,902 B2 | 4/2015 | Choi et al. | |
| 9,118,418 B2 | 8/2015 | Oh et al. | |
| 9,137,897 B2 | 9/2015 | Kozuki | |
| 9,716,066 B2* | 7/2017 | Lee | H01L 21/76871 |
| 2004/0192033 A1* | 9/2004 | Hara | H01L 25/0657 438/667 |
| 2007/0007639 A1 | 1/2007 | Fukazawa | |
| 2009/0026614 A1 | 1/2009 | Jung | |
| 2009/0278238 A1 | 11/2009 | Bonifield et al. | |
| 2010/0155940 A1 | 6/2010 | Kawashita et al. | |
| 2015/0179545 A1* | 6/2015 | Jeong | H01L 24/14 257/621 |
| 2018/0286795 A1 | 10/2018 | Maenosono et al. | |

* cited by examiner

METHOD OF FORMING VIAS USING SILICON ON INSULATOR SUBSTRATE

CROSS REFERENCE TO RELATED APPLICATION(S)

This application is a divisional of U.S. patent application Ser. No. 15/472,184 filed Mar. 28, 2017 and issued as U.S. Pat. No. 10,418,311 on Sep. 17, 2019. The aforementioned application, and issued patent, is incorporated herein by reference, in its entirety, for any purpose.

BACKGROUND

High data reliability, high speed of memory access, lower power consumption and reduced chip size are features that are demanded from semiconductor memory. In recent years, three-dimensional (3D) memory devices by stacking laminated semiconductor chips vertically stacked and interconnecting the semiconductor chips using through-silicon vias (TSVs) have been introduced. The TSVs are through electrodes that penetrate a semiconductor chip including a semiconductor substrate typically composed of silicon. Benefits of the 3D memory devices include a plurality of chips stacked with a large number of vertical vias between the plurality of chips and the memory controller, which allow wide bandwidth buses with high transfer rates between functional blocks in the plurality of chips and a considerably smaller footprint. Thus, the 3D memory devices contribute to large memory capacity, higher memory access speed and chip size reduction. The 3D memory devices include Hybrid Memory Cube (HMC) and High Bandwidth Memory (HBM).

Vias on the 3D memory devices may be formed by a "via middle" process. For example, the process may proceed by 1) disposing front bumps on a front surface of a semiconductor device; 2) thinning a back surface of a silicon substrate and exposing copper through-silicon vias by "Si reveal etching" during wafer processing (e.g., between transistor formation and a wiring process); 3) depositing a dielectric film, and 4) polishing the dielectric film by chemical mechanical planarization (CMP) to form back bumps. The via middle process described above, especially exposing copper through-silicon vias and polishing the dielectric film by CMP may cause significant manufacturing costs. In the manufacturing process, irregularity of back surface processing due to warpage of a wafer, heights of the copper through-silicon vias vary due to Si reveal etching, failures in exposing the copper through-silicon vias when a process window of the CMP is reduced, and scratches, cracks, etc., formed on a silicon board when the process window of the CMP is increased.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
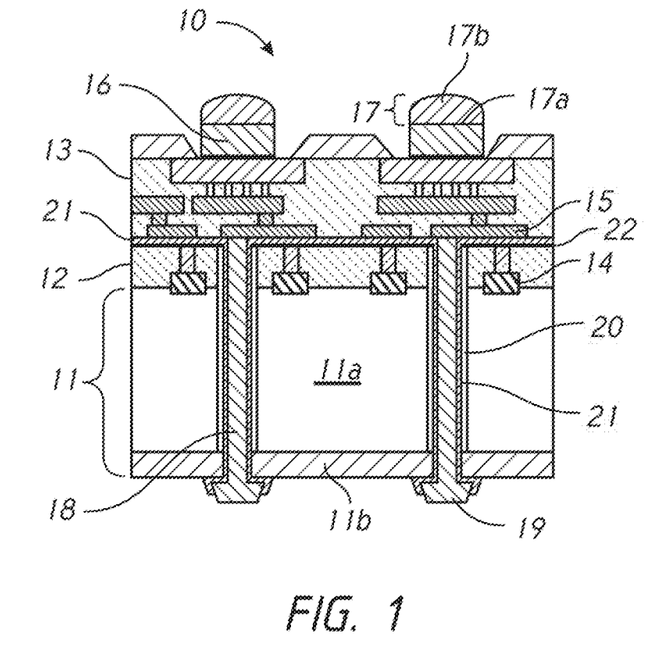
FIG. 1 is a schematic diagram of through electrodes in a chip, in accordance with an embodiment of the present disclosure.

FIG. 1 is a schematic diagram of through electrodes in a chip 10, in accordance with an embodiment of the present disclosure. FIG. 1 may be a cross-sectional view of the chip 10 including a semiconductor substrate 11, an element region 12 and a wiring region 13. For example, the semiconductor substrate 11 may be Silicon on insulator (SOI). For example, the SOI 11 may include a layer 11a made of silicon (e.g., Si layer, semiconductor layer) and a layer 11b made of silicon oxide (e.g., SiO layer, insulative layer). The SOI 11 may include another layer 11c (not shown) made of silicon in direct contact with the layer 11b on a surface of the layer 11b opposite to a surface in direct contact with the layer 11a. The layer 11c may have been removed on or before finalizing a process of manufacturing the chip 10. The element region 12 may be formed on the layer 11a of the SOI 11. The wiring region 13 may be formed on the element region 12. The element region 12 may include one or more circuit elements 14. The wiring region 13 may include wirings 15. Front bumps 16 may be formed on the wiring region 13. A connective layer 17 may be formed on each front bump 16. For example, the connective layer 17 may include a barrier layer 17a that may be implemented by nickel (Ni) on the front bump 16 and a solder layer 17b that may be implemented by tin-silver (SnAg) alloy on the barrier layer 17a. Around each through electrode 18, an inner liner 21 and an outer liner 20 may be formed as insulative films between the through electrode 18 and the SOI 11. The inner liner 21 and the outer liner 20 may be formed like a circular type cylinder, a square type cylinder or a polygonal type cylinder. For example, the inner liner 21 may be formed by anisotropic etching on the SOI 11. For example, the outer liner 20 may be implemented by silicon oxide (SiO). The inner liner 21 may prevent copper included in the through electrode 18 from diffusing into the Si layer 11a. The outer liner 20 may function as a protective film of the Si layer 11a while a cavity is being formed, which will be described later in this disclosure.

Figure 2:
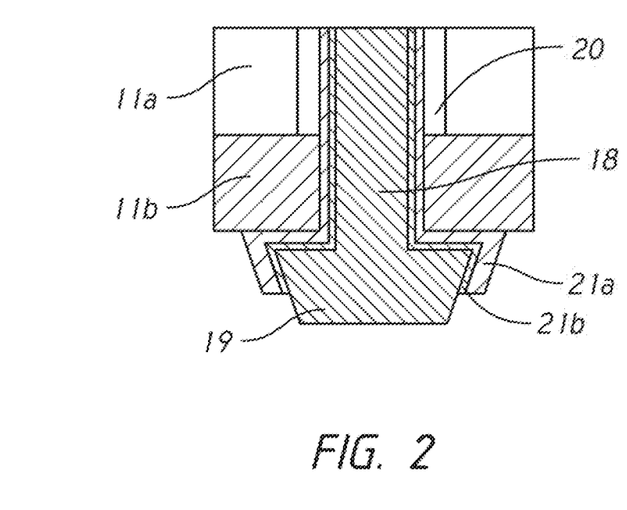
FIG. 2 is a schematic diagram of a portion of a through electrode in a chip, in accordance with an embodiment of the present disclosure.

FIG. 2 is a schematic diagram of a portion of a through electrode 18 in a chip 10, in accordance with an embodiment of the present disclosure. A through electrode 18 through layers 11a and 11b of an SOI 11 may be formed. For example, a back bump 19 protruding from the SOI 1 may be exposed by dry etching. For example, a cross-sectional width of the portion of the through electrode 18 in the Si layer 11a in the SOI 11 may be smaller than a cross-sectional width of the back bump 19. An outer liner 20 may be within the Si layer 11a of the SOI 11. An inner liner 21 may be elongated up to a side surface of each back bump 19. For example, a part of the inner liner 21 is disposed on the side surface of the back bump 19 as a sidewall spacer. The inner liner 21 may include a layer 21a made of silicon nitride (SiN) that is in direct contact with the outer liner 20 and a layer 21b made of silicon oxide (SiO) that is in direct contact with the through electrode 18 in the SOI 11. The inner liner 21 may extend to at least a portion of the side surface of the back bump 19. Thus, the conductive through electrode 18 may include a first portion through a semiconductor substrate (e.g., the Si layer 11a), a second portion protruding vertically from the first portion; and a third portion 19 protruding laterally from the second portion. Thus, the second portion, the third portion and the semiconductor substrate providing a gap therebetween, and the insulating film (11b, 20, 21a, 21b), that is formed to isolate the through electrode 18 from the Si layer 11a, includes a first part between the first portion of the electrode 18 and the semiconductor substrate (or Si layer 11a), a second part in the gap between the second and third portions of the electrode 18 and the semiconductor substrate, and a third part (respective parts of the 21a and 21b) protruding from the second part to cover a part of a side surface of the third portion with leaving a remaining part of the side surface of the third portion uncovered.

Figure 3:
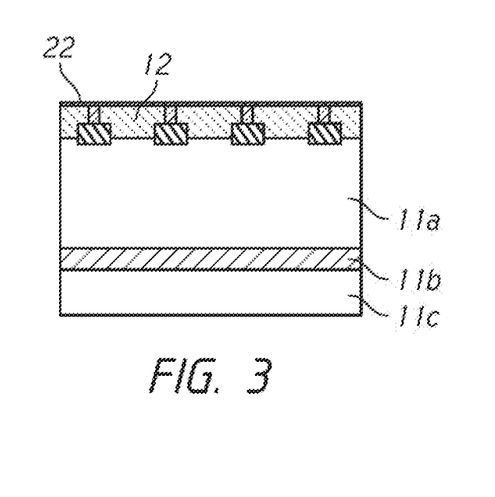
FIGS. 3-15 are schematic diagrams of a chip, in accordance with an embodiment of the present disclosure.

FIG. 3 is a schematic diagram of a chip 10, in accordance with an embodiment of the present disclosure. FIG. 3 may be a cross-sectional view of the chip 10 before dry etching for through electrodes formation. The chip 10 may include a semiconductor substrate (SOI) 11 including Si layers 11a and 11c and an SiO layer 11b between the Si layers 11a and 11c, an element region 12 and a barrier film 22. For example, the element region 12 may be formed on a surface of the Si layer 11a, opposite to a surface in direct contact with the SiO layer 11b. For example, a thickness of the Si layer 11a may be approximately 2.5 µm, a thickness of the SiO layer 11b may be approximately 20 µm, and a thickness of the element region 12 may be approximately 20 µm. The barrier film 22 may be formed on the element region 12. The barrier film 22 may serve as a prevention film of copper diffusion and as an etching stopper film. For example, the barrier film 22 may include silicon nitride (SiN), silicon carbon (SiC) and/or silicon nitride (SiN).

Figure 4:
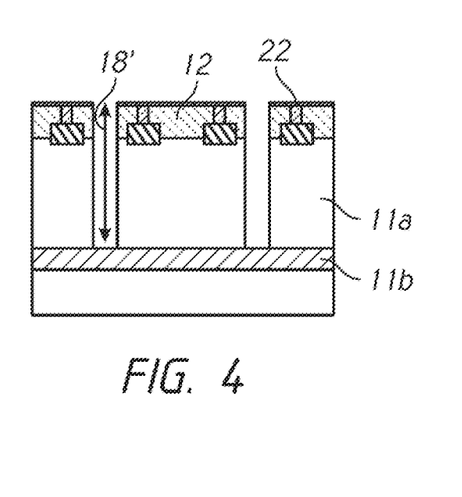

FIG. 4 is a schematic diagram of the chip 10, in accordance with an embodiment of the present disclosure. FIG. 4 may be a cross-sectional view of the chip 10 after dry etching for through electrodes formation. Dry etching for through electrodes formation may be performed through the barrier film 22, the element region 12 and the Si layer 11a. Thus, an opening 18' for the through electrode 18 may be formed through the barrier film 22, the element region 12 and the Si layer 11a by a dry etching method. For example, a Bosch method may be used for dry etching while opening the Si layer 11a. For example, sulfur hexafluoride ($SF_6$) gas maybe used for etching and octafluorocyclobutane ($C_4F_8$) gas may be used for polymer deposition. Through electrodes may be formed by the via middle method as shown in FIG. 4, or other processes, such as a "via first" method.

Figure 5:
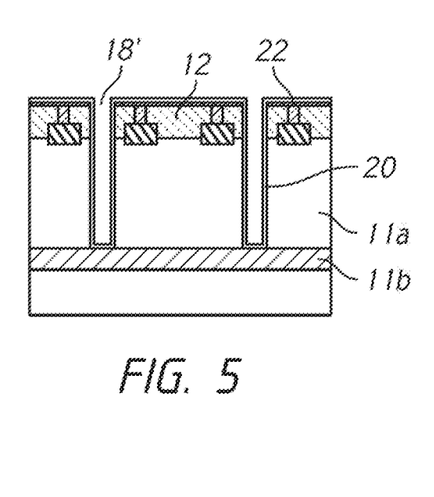

FIG. 5 is a schematic diagram of the chip 10, in accordance with an embodiment of the present disclosure. FIG. 5 may be a cross-sectional view of the chip 10 after depositing an outer liner 20 in the opening 18'. For example, the outer liner 20 may be an SiO layer and deposited at approximately 350-500° C. A thickness of the outer liner 20 may be approximately 1 µm. In this process, an SiO film or a laminate film including an SiO layer and a SiN layer maybe used. For example, the laminate film may include the SiO layer having a thickness of approximately 0.3 µm and an SiN layer having a thickness of approximately 0.7 µm. Alternatively, the laminate film may include an SiO layer having a thickness of approximately 0.7 µm and an SiN layer having a thickness of approximately 0.3 µm.

Figure 6:
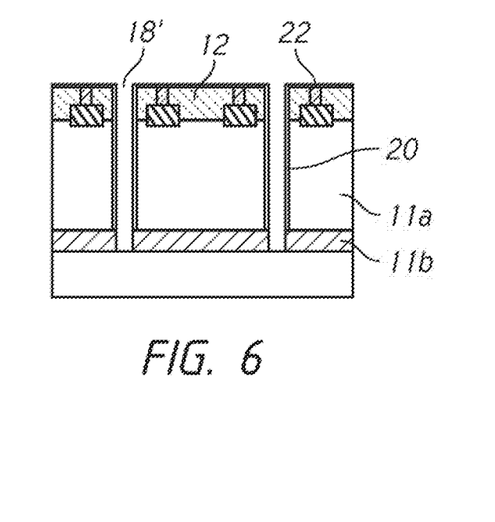

FIG. 6 is a schematic diagram of the chip 10, in accordance with an embodiment of the present disclosure. FIG. 6 may be a cross-sectional view of the chip 10 after etching the SiO layer 11b of the SOI 11. A portion of the outer liner 20 facing the SiO layer 11b of the SOI 11 at a bottom of the opening 18' and a portion of the SiO layer 11b under the bottom of the opening 18' may be opened by etching in order to expose the Si layer 11c under the bottom of the opening 18'. Forming the opening 18' may be performed by an anisotropic dry etching method using one or a combination of gases, such as tetrafluoromethane ($CF_4$) gas, octafluorocyclobutane ($C_4F_8$) gas, hexafluorobutadiene ($C_4F_6$) gas, octafluorocyclopentene ($C_5F_8$) gas, oxygen ($O_2$) gas, carbon monoxide (CO) gas, argon (Ar) gas, etc. The outer liner 20 on the barrier film 22 may be removed by the anisotropic dry etching using the barrier film 22 as a stopper for etching. The outer liner 20 on a sidewall of the through electrode 18 may remain in the Si layer 11a.

Figure 7:
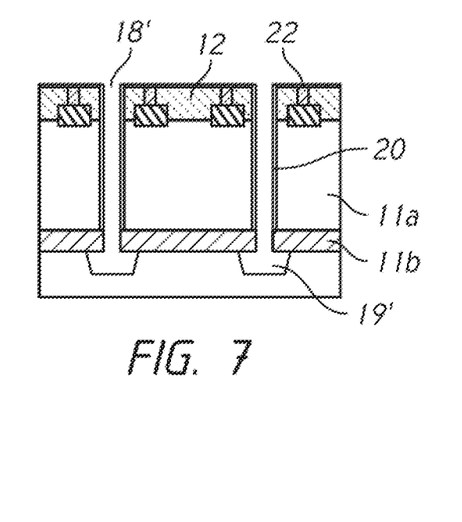

FIG. 7 is a schematic diagram of the chip 10, in accordance with an embodiment of the present disclosure. FIG. 7 may be a cross-sectional view of the chip 10 after etching the exposed Si layer 11c. For example, the exposed Si layer 11c may be etched by an anisotropic wet etching method. For example, the anisotropic wet etching method may employ a potassium hydroxide (KOH)-based solution in order to form cavities 19' having a depth of approximately 2 µm-5 µm. In the anisotropic wet etching, the cavities 19' having a trapezoid body for back bumps 19 may be formed by using different etching speeds in the Si layer 11c. Thus, each cavity 19' of the cavities 19' may have a sidewall slanted and each back bump 19 may be tapered towards an opposite side to the opening 18' to have a side surface of the back bump 19 slanted. For etching to form cavities 19', an isotropic wet etching method or an isotropic dry etching method may be used instead of the anisotropic dry etching method. A shape of cavities 19' may be different depending on the etching method. The outer liner 20 may remain on the sidewall of the opening 18'.

Figure 8:
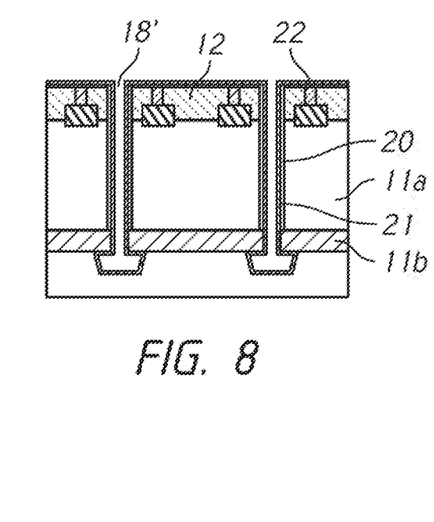

FIG. 8 is a schematic diagram of the chip 10, in accordance with an embodiment of the present disclosure. FIG. 8 may be a cross-sectional view of the chip 10 after forming an inner liner 21 on an inner wall of the opening 18', the cavity 19' and the barrier film 22. For example, the inner liner 21 may be a laminate film including an SiO film of 0.3 µm thickness on an SiN film including a thickness of 0.2 µm by an atomic layer deposition (ALD) method. The SiN film may prevent copper diffusion into the Si layer while filling copper in the opening 18' and the cavity 19'. Preferably, a thickness of the SiN film may be small enough to prevent from increasing parasitic capacitance between the through electrode 18 and an adjacent through electrode. The SiO film may be formed to complement the thickness of the SiN film. The SiO film may be inferior to the SiN film in preventing the copper diffusion, while the SiO film may be superior to the SiN film in preventing the parasitic capacitance.

Figure 9:
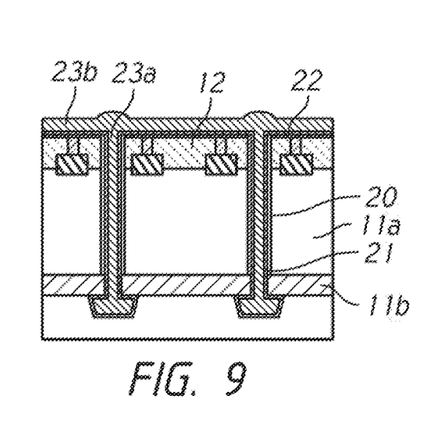

FIG. 9 is a schematic diagram of the chip 10, in accordance with an embodiment of the present disclosure. FIG. 9 may be a cross-sectional view of the chip 10 after applying a conductive material in the opening 18' and the cavity 19'. For example, a conductive material may be filled by copper plating. For example, copper plating may be performed by a bottom up copper plating method after applying the atomic layer deposition (ALD) to introduce a barrier layer 23a (e.g., tantalum (Ta) and/or tantalum nitride (TaN)) and a seed layer 23b (e.g. copper) on an inner wall of the opening 18' and the cavity 19'. Alternatively, electron beam-induced deposition, copper deposition, or melted metal filling may be used in place of the bottom up copper plating method.

Figure 10:
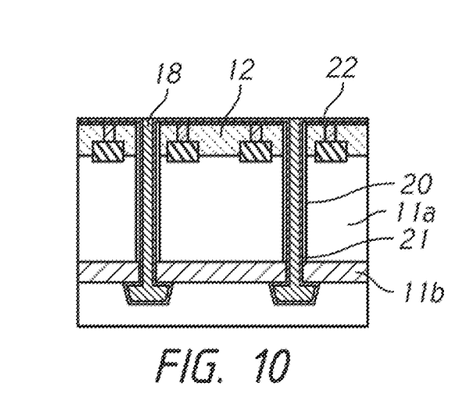

FIG. 10 is a schematic diagram of the chip 10, in accordance with an embodiment of the present disclosure. FIG. 10 may be a cross-sectional view of the chip 10 after removing the copper on the barrier film 22. For example, the copper on the barrier film 22 may be removed by chemical mechanical planarization (CMP). For example, a part of the inner liner 21 may remain over the barrier film 22 to cover the element region 12. Thus, through electrodes 18 may be formed to fill the opening 18' and the cavity 19'.

Figure 11:
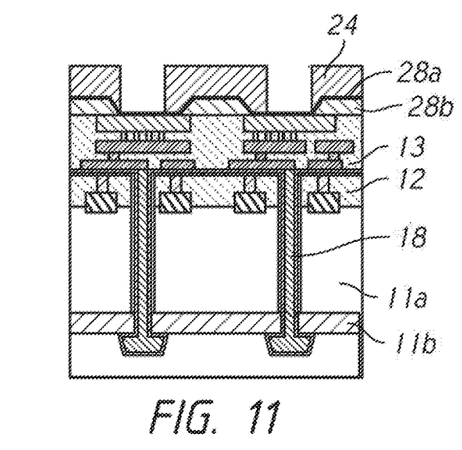

FIG. 11 is a schematic diagram of the chip 10, in accordance with an embodiment of the present disclosure. FIG. 11 may be a cross-sectional view of the chip 10 after forming a photo resist 24 for some front bumps. For example, a wiring region 13 may be formed on the barrier film 22 on the element region 12. A patterned passivation layer 28b and barrier-seed layer 28a comprising a barrier layer (e.g. a titanium (Ti) layer having a thickness of 15 nm) and a seed layer (e.g. a copper (Cu) layer having a thickness of 200 nm) may be formed on a top surface of the wiring region 13. After forming a photo resist 24 for some front bumps, a front bump formation area on the photo resist 24 may be opened to expose the barrier-seed layer 28a. For example, a thickness of the photo resist 24 may be approximately 50 μm.

Figure 12:
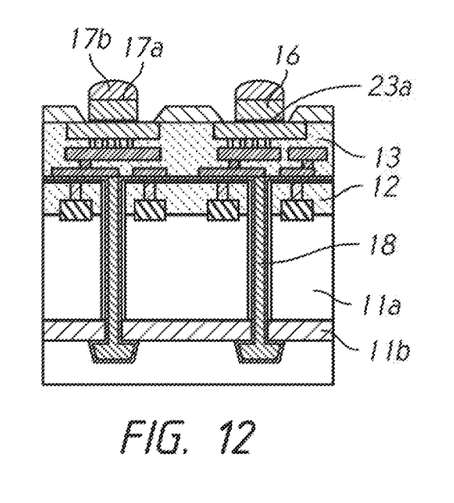

FIG. 12 is a schematic diagram of the chip 10, in accordance with an embodiment of the present disclosure. FIG. 12 may be a cross-sectional view of the chip 10 after forming front bumps 16. The front bumps 16 may be formed by copper plating on the exposed barrier-seed layer 28a. For example, a thickness of the front bump from the copper plating may be approximately 10 μm. For example, after copper plating, the connective layer 17 may be continuously formed by electro plating. The connective layer 17 may include a barrier layer 17a having a thickness of 3 μm and a solder layer 17b having a thickness of 15 μm. For example, the barrier layer 17a may be implemented by nickel (Ni) on the front bump 16 and the solder layer 17b may be implemented by tin-silver (SnAg) solder on the barrier layer 17a. After removing the photo resist 24 using a plasma ashing and an ammonia ($NH_3$)-based solution, the exposed barrier-seed layer 28a may be removed with a phosphoric acid solution while using the front bumps as a mask.

Figure 13:
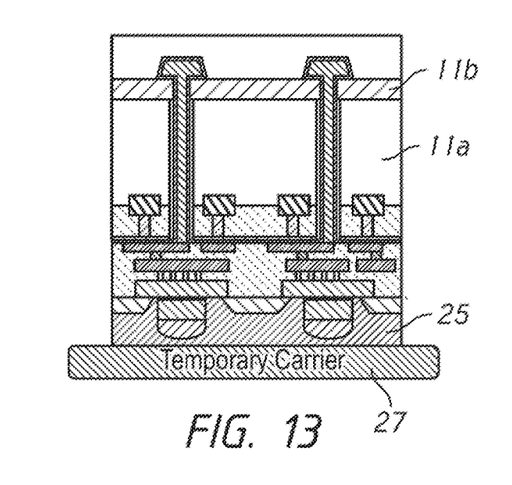

FIG. 13 is a schematic diagram of the chip, in accordance with an embodiment of the present disclosure. FIG. 13 may be a cross-sectional view of the chip 10 after applying a temporary carrier 27 on the chip 10. For example, the chip 10 may be flipped vertically. The front bumps 16 may be adhered to the temporary carrier 27 by heat resistant adhesive material 25.

Figure 14:
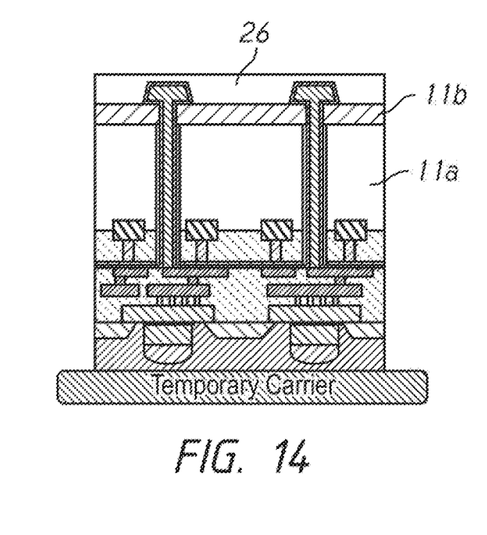

FIG. 14 is a schematic diagram of through electrodes in a chip, in accordance with an embodiment of the present disclosure. FIG. 14 may be a cross-sectional view of the chip 10 after removing a portion of the SOI 11. For example, a portion of the exposed Si layer 11c may be removed by backside grinding (BG) and/or chemical mechanical polishing (CMP). A thickness of the portion of the exposed Si layer 11c for removal may be controlled to protect the through electrodes 18 from being exposed to prevent the Si layer 11c from copper contamination from the through electrodes 18. Thus, a residual silicon layer 26 may remain after the removal of the portion of the SOI 11 (e.g., the Si layer 11c). The residual silicon layer 26 may cover the back bumps 19.

Figure 15:
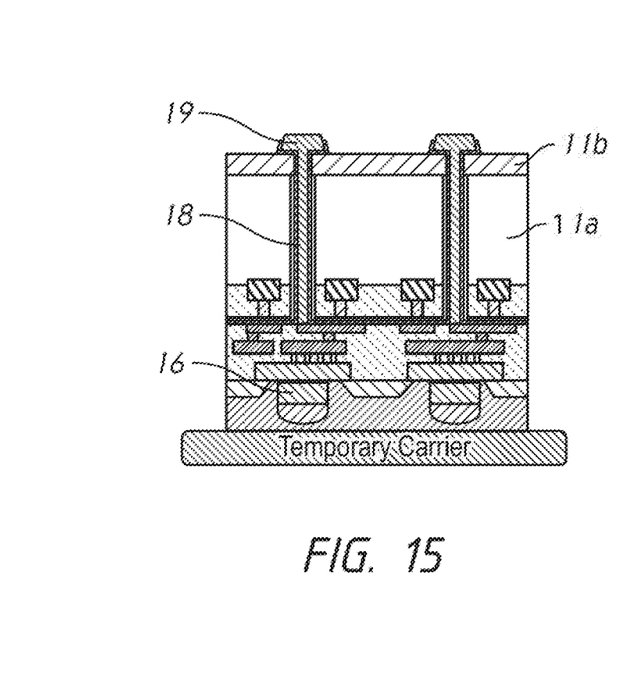

FIG. 15 is a schematic diagram of through electrodes in a chip, in accordance with an embodiment of the present disclosure. FIG. 15 may be a cross-sectional view of the chip 10 after exposing back bumps 19 by Si revealing dry etching and dielectric film overetching. For example, the residual silicon layer 26 on the SiO layer 11b may be removed. For example, a sulfur hexafluoride ($SF_6$) gas-based dry etching may have etch selectivity of the SiO layer 11b to the inner liner 21 that is approximately 20-50. The inner liner 21 surrounding the back bumps 19 may be etched with an etching gas to expose the back bumps 19. The etching gas may be a gas mixture of fluorocarbon gas and inert gas. Etching of the inner liner 21 and the barrier 23a may be performed until exposing the back bumps 19. For example, the back bumps 19 may be exposed by anisotropic etching. Thus, a top surface of each back bumps 19 may be completely exposed while a portion of the inner liner 21 may remain on the back bump 19. After exposing the back bump 19, post treatment such as alkaline solution including corrosion inhibitor may be performed to prevent copper corrosion and to remove an etching residue.

Thus, the through electrodes in a chip according to an embodiment of the present disclosure may be formed by a method that includes: providing a substrate 11 comprising a semiconductor layer 11a, a sacrificial layer 11c and an insulative layer 11b between the semiconductor layer 11a and the sacrificial layer 11c; forming an opening 18' through the semiconductor layer 11a and the insulative layer 11b; etching the sacrificial layer 11c to form a cavity 19' in the sacrificial layer 11c; applying a conductive material 23 in the opening 18' and the cavity 19' to form an electrode 18 with a back bump 19 (e.g., a first bump); and exposing a portion of the back bump 19.

Figure 16:
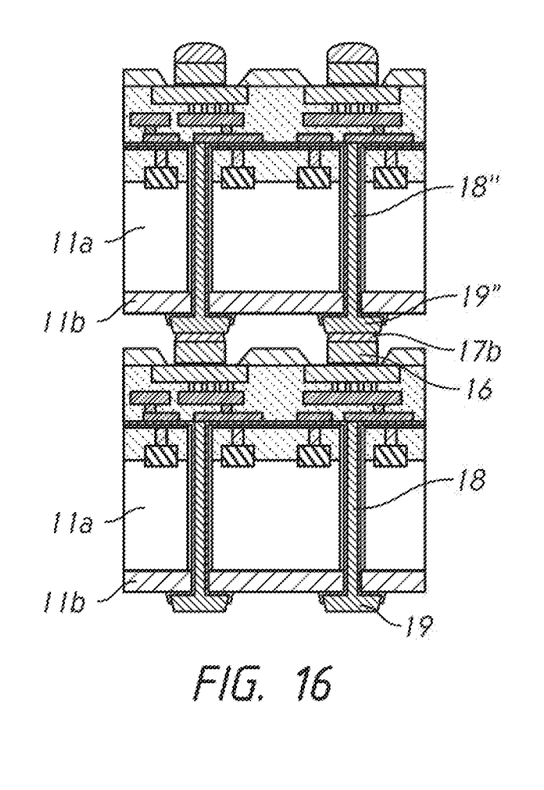
FIG. 16 is a schematic diagram of through electrodes in stacked chips of a semiconductor device, in accordance with an embodiment of the present disclosure.

FIG. 16 is a schematic diagram of through electrodes in stacked chips of a semiconductor device, in accordance with an embodiment of the present disclosure. FIG. 16 may be a cross-sectional view of the chip 10 after each back bump 19 is physically connected to each corresponding front bump 16 via the connective layer 17. For example, a cross-sectional width of the back bump 19 may be larger than a cross-sectional width of the front bump 16. In order to reduce defects due to solder fluidity of tin-silver (SnAg) solder that may cause the connective layer 17b to move towards a side wall of the back bump 19 and to drop from the connective layer 17b, the cross-sectional width of the back bump 19 may be designed larger than the cross-sectional width of the front bump 16.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above. Further, it is intended that in addition to the apparatuses and methods as set forth in the claim section, the following apparatuses and methods are included in the scope of this disclosure:

AA. An apparatus comprising:
a substrate including a first surface and a second surface opposite to the first surface;
a circuit element in the first surface;
a first electrode through the substrate from the first surface to the second surface, the first electrode including:
a first portion disposed in the substrate; and
a second portion continuous to the first portion and protruding from the second surface; and
a first insulative film around the first electrode, wherein the first insulative film is disposed between the first portion of the first electrode and the substrate and extends to a side surface of the second portion of the first electrode.

AB. The apparatus of AA, wherein the first insulative film comprises a silicon nitride film and is configured to cover the circuit element in the first surface.

AC. The apparatus of AA, wherein the substrate includes a semiconductor layer including the first surface and an insulative layer including the second surface.

AD. The apparatus of AC, wherein the insulative layer of the substrate is made of silicon oxide.

AE. The apparatus of AC, further comprising:
a second insulative film disposed between the semiconductor layer of the substrate and the first insulative film.

AF. The apparatus of AA, further comprising:
a second electrode over the first surface of the substrate, and wherein a cross-sectional width of the second electrode is different from a cross-sectional width of the second portion of the first electrode.

AG. The apparatus of AF, wherein the cross-sectional width of the second electrode is greater than the cross-sectional width of the second portion of the first electrode.

AH. The apparatus of AA, wherein the substrate is a silicon on insulator (SOI) substrate.

AI. The apparatus of AA, wherein a cross-sectional width of the first portion in the substrate is smaller than a cross-sectional width of the second portion.

BA. A method comprising: providing a substrate including a first surface and a second surface opposite to the first surface, wherein the substrate comprises a first semiconductor layer including the first surface, a sacrificial layer including the second surface and an insulative layer between the first semiconductor layer and the sacrificial layer;
etching the first semiconductor layer of the substrate until an opening reach the insulative layer of the substrate;
depositing a first liner in the opening;
etching a portion of the first liner facing the insulative layer of the substrate at a first end of the opening and a portion of the insulative layer under the first end of the opening to expose the sacrificial layer of the substrate;
etching the sacrificial layer to form a cavity;
depositing a second liner on the first liner in the opening and the cavity;
applying a conductive material in the opening and the cavity to form an electrode in the opening and a first bump in the cavity;
and
removing a portion of the sacrificial layer and a portion of the first liner on the first bump to expose a portion of the first bump.

BB. The method of BA, wherein the insulative layer is made of silicon oxide.

BC. The method of BA, the first and sacrificial layer are made of single crystalline silicon respectively.

BD. The method of BC, wherein the dry etching is performed with sulfur hexafluoride.

BE. The method of BA, wherein etching the portion of the first liner and the portion of the insulative layer is performed by anisotropic dry etching.

BF. The method of BA, wherein etching the sacrificial layer to form the cavity includes forming the cavity having a cross-sectional width greater than a cross-sectional width of the opening.

BG. The method of BA, wherein applying a conductive material in the opening and the cavity includes one of copper plating, electron beam-induced deposition, copper deposition, or melted metal filling.

BH. The method of BA, wherein removing a portion of the sacrificial layer and a portion of the first liner includes at least one of backside grinding and chemical mechanical polishing.

BI. The method of BA, wherein the method further comprises providing an element region in the first surface of the first semiconductor layer before etching the first semiconductor layer of the substrate.

BJ. The method of BI, wherein the method further comprises forming a wiring in a wiring region over the element region after applying the conductive material in the opening and the cavity.

BK. The method of BJ, wherein the method further comprises forming a second bump over the wiring region before removing the portion of the sacrificial layer and the portion of the first liner on the first bump.

What is claimed is:
1. An apparatus comprising:
a substrate including a semiconductor layer including a first surface and an insulative layer including a second surface opposite to the first surface;
a circuit element in the first surface;
a first electrode through the substrate from the first surface to the second surface, the first electrode including:
a first portion disposed in the substrate; and
a second portion continuous to the first portion and protruding from the second surface; and
a third portion protruding laterally from the second portion, the third portion including a side surface to define a width of the third portion; and
a first insulative film around the first electrode, wherein the first insulative film is disposed between the first portion of the first electrode and the substrate, extends along the second surface and along the third portion of the first electrode, and further extends to a portion of a side surface of the third portion of the first electrode.

2. The apparatus of claim 1, wherein the first insulative film comprises a silicon nitride film and is configured to cover the circuit element in the first surface.

3. The apparatus of claim 1, wherein the insulative layer of the substrate is made of silicon oxide.

4. The apparatus of claim 1, further comprising:
a second insulative film disposed between the semiconductor layer of the substrate and the first insulative film.

5. The apparatus of claim 1 further comprising:
a second electrode over the first surface of the substrate, and wherein a cross-sectional width of the second electrode is different from a cross-sectional width of the second portion of the first electrode.

6. The apparatus of claim 5, wherein the cross-sectional width of the second electrode is greater than the cross-sectional width of the second portion of the first electrode.

7. The apparatus of claim 1, wherein the substrate is a silicon on insulator (SOI) substrate.

8. The apparatus of claim 1, wherein a cross-sectional width of the first portion in the substrate is smaller than a cross-sectional width of the second portion.

9. The apparatus of claim 1, wherein the substrate is a silicon on insulator (SOI) substrate, wherein the first electrode is a through electrode, and wherein the second portion of the first electrode is a back bump of the through electrode.

10. A chip comprising:
a silicon on insulator (SOI) substrate including a first surface;
a through electrode including:
a first portion disposed inside the SOI substrate;
a second portion continuous with the first portion of the through electrode, the second portion protruding above the first surface of the SOI substrate to form a back bump, wherein the back bump of the through electrode includes a side portion which is not parallel to the first surface; and
an insulative film extending between the first portion of the through electrode and the SOI substrate and extending along at least a portion of the side portion of the back bump of the through electrode.

11. The chip of claim 10, wherein the back bump of the through electrode includes a surface which is generally parallel to the first surface of the SOI substrate.

12. The chip of claim 10, wherein the first portion of the through electrode has a first cross-sectional width, and wherein the back bump of the through electrode has a second cross-sectional width greater than the first cross-sectional width.

13. The chip of claim 10, wherein the SOT substrate includes a second surface generally parallel to the first surface, wherein the first portion of the through electrode extends from the first surface to the second surface of the SOI substrate.

14. The chip of claim 13, wherein the SOT substrate includes a semiconductor layer including the second surface, wherein the apparatus further comprises a second insulative film disposed between the insulative film and the semiconductor layer.

15. The chip of claim 13, further comprising at least one circuit element disposed in the second surface of the SOI substrate.

16. The apparatus of claim 1, wherein the first insulative film and the insulative layer of the substrate are configured to isolate the first electrode from the semiconductor layer of the substrate.

* * * * *

UNITED STATES PATENT AND TRADEMARK OFFICE
CERTIFICATE OF CORRECTION

PATENT NO. : 11,257,744 B2
APPLICATION NO. : 16/543378
DATED : February 22, 2022
INVENTOR(S) : Maenosono et al.

Page 1 of 1

It is certified that error appears in the above-identified patent and that said Letters Patent is hereby corrected as shown below:

In the Claims

|  | Reads | Should Read |
|---|---|---|
| Column 10, Line 6 Claim 13 | "wherein the SOT substrate" | --wherein the SOI substrate-- |
| Column 10, Line 11 Claim 14 | "wherein the SOT substrate" | --wherein the SOI substrate-- |

Signed and Sealed this
Nineteenth Day of April, 2022

Katherine Kelly Vidal
*Director of the United States Patent and Trademark Office*